US010756254B2

(12) United States Patent
Tanno et al.

(10) Patent No.: US 10,756,254 B2
(45) Date of Patent: Aug. 25, 2020

(54) COMPOSITE SUBSTRATE AND METHOD OF MANUFACTURING COMPOSITE SUBSTRATE

(71) Applicant: SHIN-ETSU CHEMICAL CO., LTD., Tokyo (JP)

(72) Inventors: Masayuki Tanno, Gunma (JP); Kazutoshi Nagata, Gunma (JP); Shoji Akiyama, Gunma (JP); Koji Kato, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/339,910

(22) PCT Filed: Oct. 5, 2017

(86) PCT No.: PCT/JP2017/036310
§ 371 (c)(1),
(2) Date: Apr. 5, 2019

(87) PCT Pub. No.: WO2018/066653
PCT Pub. Date: Apr. 12, 2018

(65) Prior Publication Data
US 2020/0052189 A1 Feb. 13, 2020

(30) Foreign Application Priority Data
Oct. 6, 2016 (JP) .................... 2016-198521

(51) Int. Cl.
*H01L 41/253* (2013.01)
*H01L 41/187* (2006.01)
(Continued)

(52) U.S. Cl.
CPC ........ *H01L 41/253* (2013.01); *H01L 41/1873* (2013.01); *H01L 41/312* (2013.01);
(Continued)

(58) Field of Classification Search
CPC ..................................................... H01L 41/253
(Continued)

(56) References Cited

U.S. PATENT DOCUMENTS

| 6,445,265 B1* | 9/2002 | Wright | ..................... H03H 3/08 333/193 |
| 2010/0108248 A1* | 5/2010 | Hayakawa | ............ H01L 41/312 156/247 |

FOREIGN PATENT DOCUMENTS

| EP | 2658123 | 10/2013 |
| JP | 2002-534886 | 10/2002 |

(Continued)

OTHER PUBLICATIONS

H. Kando et al., "Improvement in Temperature Characteristics of Plate Wave Resonator Using Rotated Y-Cut LiTaO3/SIN Structure", Micro Electro Mechanical Systems (MEMS), 2011, pp. 768-771.
(Continued)

*Primary Examiner* — Brent T O'Hern
(74) *Attorney, Agent, or Firm* — Greenblum & Bernstein, P.L.C.

(57) ABSTRACT

An object of the present invention is to provide a method of manufacturing a composite substrate including a piezoelectric layer with less Li amount variation and a support substrate. A method of manufacturing a composite substrate of the present invention includes a step of performing ion implantation into a piezoelectric substrate, a step of bonding the piezoelectric substrate and the support substrate, a step of separating the bonded substrate, at an ion-implanted portion of the piezoelectric substrate, into the piezoelectric layer bonded to the support substrate and the remaining piezoelectric substrate after the step of bonding the piezo-
(Continued)

electric substrate and the support substrate, and a step of diffusing Li into the piezoelectric layer after the separating step.

10 Claims, 5 Drawing Sheets

(51) Int. Cl.
    *H01L 41/312* (2013.01)
    *H03H 3/08* (2006.01)
    *H03H 9/02* (2006.01)
    *H03H 9/25* (2006.01)
(52) U.S. Cl.
    CPC .......... *H03H 3/08* (2013.01); *H03H 9/02559* (2013.01); *H03H 9/02574* (2013.01); *H03H 9/25* (2013.01)
(58) Field of Classification Search
    USPC ........................................................ 428/141
    See application file for complete search history.

(56) References Cited

FOREIGN PATENT DOCUMENTS

| | | |
|---|---|---|
| JP | 2010-109909 | 5/2010 |
| JP | 2016121429 A * | 7/2016 |
| JP | 2016-139837 | 8/2016 |
| WO | 2012/086639 | 6/2012 |
| WO | 2016/121429 | 8/2016 |

OTHER PUBLICATIONS

International Preliminary Report on Patentability issued in International Bureau of WIPO Patent Application No. PCT/JP2017/036310, dated Dec. 19, 2017.
International Search Report issued in International Application No. PCT/JP2017/036310, dated Dec. 19, 2017.

* cited by examiner

COMPOSITE SUBSTRATE AND METHOD OF MANUFACTURING COMPOSITE SUBSTRATE

TECHNICAL FIELD

The present invention relates to a composite substrate including a piezoelectric layer containing lithium tantalate and the like and a support substrate and a method of manufacturing a composite substrate.

BACKGROUND ART

A surface acoustic wave (SAW) device having a piezoelectric substrate on which a comb electrode (IDT) for exciting a surface acoustic wave is formed is used as a component for frequency adjustment and selection in mobile phones and the like.

The surface acoustic wave device is required to have a small size, a low insertion loss, and unnecessary wave impermeability, and a piezoelectric material such as lithium tantalate ($LiTaO_3$; LT) or lithium niobate ($LiNbO_3$; LN) is used.

Meanwhile, communication standards for mobile phones of or after the fourth generation have narrower frequency band intervals in transmission and reception and wider bandwidth. Under such communication standards, the piezoelectric material used for the surface acoustic wave device is required to have a sufficiently small characteristic variation due to temperature. Further, shoulder characteristics of filters and duplexers need to be extremely steep so that extra noise does not occur between bands, and a high Q value is required.

With respect to the material used for such a surface acoustic wave device, composite substrates containing a piezoelectric material and another material have been investigated. For example, Patent Document 1 discloses a composite substrate having a high speed sound film in which the sound speed of a propagating bulk wave is higher than the sound speed of an acoustic wave propagating in a piezoelectric film, a low sound speed film in which the sound speed of a propagating bulk wave is lower than the sound speed of an acoustic wave propagating in the piezoelectric film, and the piezoelectric film stacked in order on a support substrate, and an acoustic wave device using the composite substrate can increase the Q value.

Furthermore, Patent Document 1 describes that the piezoelectric film is formed by ion implantation as a method of manufacturing this composite substrate.

Further, Non Patent Document 1 discloses a method of bonding a lithium tantalate substrate implanted with $H^+$ ions to a support substrate via a SiN film or an $SiO_2$ film, and then separating the lithium tantalate substrate into two.

PRIOR ART REFERENCES

Patent Document

Patent Document 1: WO 2012/086639 A

Non Patent Document

Non Patent Document 1: H. Kando, et al., "IMPROVEMENT IN TEMPERATURE CHARACTERISTICS OF PLATE WAVE RESONATOR USING ROTATED Y-CUT LiTaO3/SIN STRUCTURE", Micro Electro Mechanical Systems (MEMS), 2011 IEEE 24th International Conference on, 2011, pp. 768-771

SUMMARY OF THE INVENTION

Problems to be Solved by the Invention

In the method of manufacturing a composite substrate with ion implantation, while a composite substrate having a piezoelectric film with thin film thickness and excellent film thickness uniformity can be obtained, the inventors of the present invention have found that there are some problems as a result of detailed investigation of the method of manufacturing a composite substrate with ion implantation.

That is, in the case of applying ion implantation to the $LiTaO_3$ substrate as used in Patent Document 1 or Non Patent Document 1 and separating the $LiTaO_3$ substrate, implanted ions such as $H^+$ flick out a part of Li ions in the $LiTaO_3$ substrate. Therefore, it has been found that the Li amount varies in a formed LiTaO3 layer. Such variation in the Li amount becomes apparent as characteristic variation of a sound speed of a surface acoustic wave and an electromechanical coupling coefficient, which becomes a serious problem in manufacturing the surface acoustic wave device.

Furthermore, in this case, since the Li amount in the LiTaO3 layer decreases, the performance of $LiTaO_3$ as a piezoelectric material is deteriorated. For example, in a case of fabricating a composite substrate with ion implantation using a $LiTaO_3$ substrate having a congruent melting (congruent) composition (Li/Li+Ta=48.5 mol %) as a piezoelectric substrate, the Li amount decreases to 48.5 mol % or less.

Further, even in a case of using a $LiTaO_3$ substrate having a stoichiometric composition (Li/Li+Ta=49.95 to 50.0 mol %) prepared by a double crucible method or the like as the piezoelectric substrate, the Li amount decreases, by at least about 0.1%, to 49.9 mol % or less.

For this reason, conventionally, a composite substrate having a $LiTaO_3$ layer having a stoichiometric composition with thin film thickness and excellent film thickness uniformity, which is difficult to obtain by a fabrication method by polishing and grinding, cannot be obtained.

Therefore, an object of the present invention is to provide a composite substrate including a piezoelectric layer with less Li amount variation and a support substrate, and a method of manufacturing a composite substrate.

Means for Solving the Problems

As a result of intensive studies to achieve the above object, the present inventors have found that variation in the Li amount in a piezoelectric layer can be suppressed by application of Li diffusion to the piezoelectric layer, and have reached the present invention.

That is, the present invention is a method of manufacturing a composite substrate including a piezoelectric layer and a support substrate, the method including: a step of performing ion implantation into a piezoelectric substrate; a step of bonding the piezoelectric substrate and the support substrate; a step of separating the bonded substrate, at an ion-implanted portion of the piezoelectric substrate, into the piezoelectric layer bonded to the support substrate and the remaining piezoelectric substrate after the step of bonding the piezoelectric substrate and the support substrate; and a step of diffusing Li into the piezoelectric layer after the separating step.

Further, in the present invention, it is preferable to include a step of increasing a temperature of the piezoelectric substrate to a temperature equal to or higher than a Curie temperature and decreasing the temperature of the piezoelectric substrate to a temperature equal to or lower than the Curie temperature while an electric field is applied, after the step of bonding the piezoelectric substrate and the support substrate, and a step of increasing a temperature of the piezoelectric substrate to recover a piezoelectric property, after the step of bonding the piezoelectric substrate and the support substrate, can also be included.

In the present invention, the step of bonding the piezoelectric substrate and the support substrate is preferably performed by a surface activation normal temperature bonding method, and an intervening layer can be provided between the piezoelectric layer and the support substrate.

The piezoelectric layer is preferably set to have a quasi-stoichiometric composition in the step of diffusing Li into the piezoelectric layer of the present invention, and further, the ion species in the step of performing ion implantation into a piezoelectric substrate is preferably at least one type of ion selected from a hydrogen ion, a hydrogen molecular ion, and a helium ion.

The piezoelectric substrate of the present invention preferably has a range in which Li concentration differs in a thickness direction, and the piezoelectric substrate preferably contains lithium tantalate or lithium niobate. Further, the support substrate preferably contains at least one material selected from silicon, sapphire, silicon carbide, and spinel.

The present invention is a method of manufacturing a composite substrate including a piezoelectric layer and a support substrate, the method including: a step of performing ion implantation into a piezoelectric substrate; a step of bonding the piezoelectric substrate and the support substrate; and a step of separating the bonded substrate, at an ion-implanted portion of the piezoelectric substrate, into the piezoelectric layer bonded to the support substrate and the remaining piezoelectric substrate after the step of bonding the piezoelectric substrate and the support substrate, wherein the piezoelectric substrate is lithium tantalate, has a portion in which Li concentration is 48.5±0.5% and a portion in which the Li concentration is 50.0±0.5%, and has a range in which the Li concentration becomes higher on a substrate surface side in a thickness direction.

The present invention is a method of manufacturing a composite substrate including a piezoelectric layer and a support substrate, the method including: a step of performing ion implantation into a piezoelectric substrate; a step of bonding the piezoelectric substrate and the support substrate; and a step of separating the bonded substrate, at an ion-implanted portion of the piezoelectric substrate, into the piezoelectric layer bonded to the support substrate and the remaining piezoelectric substrate after the step of bonding the piezoelectric substrate and the support substrate, wherein the piezoelectric substrate is lithium tantalate or lithium niobate, and Li concentration at a depth position of the piezoelectric substrate implanted with ions is greater than 50.0%.

The present invention is a method of manufacturing a composite substrate including a piezoelectric layer and a support substrate, the method including: a step of performing ion implantation into a piezoelectric substrate; a step of bonding the piezoelectric substrate and the support substrate; and a step of separating the bonded substrate, at an ion-implanted portion of the piezoelectric substrate, into the piezoelectric layer bonded to the support substrate and the remaining piezoelectric substrate after the step of bonding the piezoelectric substrate and the support substrate, wherein the piezoelectric substrate is lithium tantalate, has a portion in which Li concentration is 48.5±0.5% and a portion in which the Li concentration is 50.0±0.5%, has a range in which the Li concentration becomes higher on a substrate surface side in a thickness direction, and the Li concentration at a depth position of the piezoelectric substrate implanted with ions is greater than 50.0%.

In the present invention, the Li concentration, at a range from a surface of the piezoelectric substrate on a side bonded to the support substrate to a depth position implanted with ions, is preferably from 49.0% to 52.5%, both inclusive. Further, an intervening layer is preferably provided between the piezoelectric layer and the support substrate.

The present invention is a composite substrate including: a piezoelectric layer and a support substrate, wherein the piezoelectric layer is lithium tantalate or lithium niobate, Li concentration of a surface of the piezoelectric layer is greater than 49.9%, a thickness of the piezoelectric layer is equal to or lower than 1.0 μm, and a maximum height Rz value of surface roughness of the piezoelectric layer is equal to or lower than 10% of the thickness of the piezoelectric layer.

In the present invention, an intervening layer is preferably present between the piezoelectric layer and the support substrate.

Advantageous Effects of Invention

According to the present invention, a composite substrate with less Li amount variation in a piezoelectric layer can be manufactured. Further, a surface acoustic wave device having excellent characteristics can be stably manufactured by use of the composite substrate manufactured according to the present invention.

Further, according to the present invention, a composite substrate having a $LiTaO_3$ layer having a stoichiometric composition and having a piezoelectric layer with thin film thickness and excellent film thickness uniformity can be manufactured.

DESCRIPTION OF EMBODIMENTS

Figure 1:
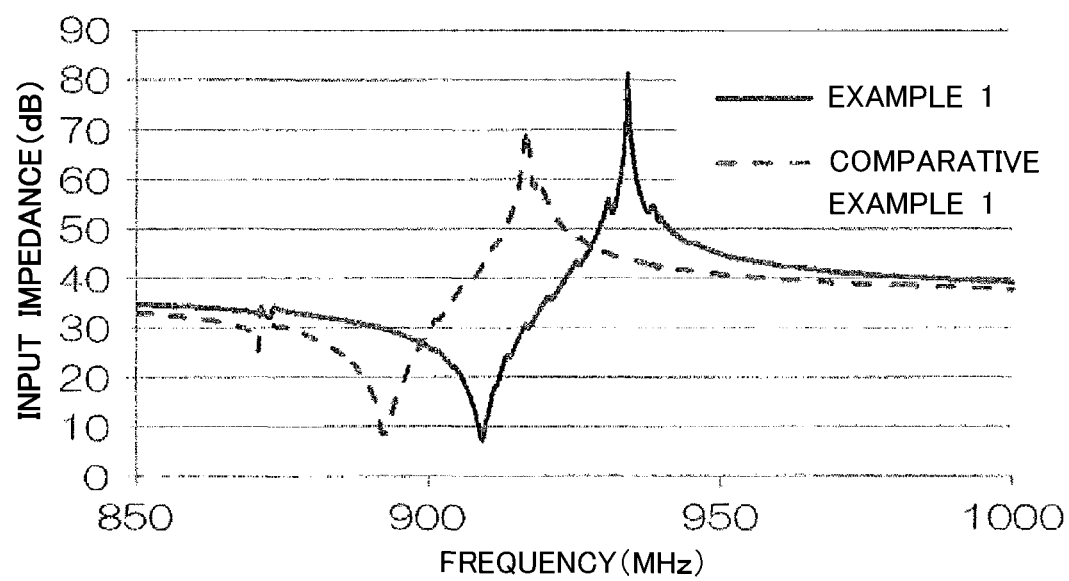
FIG. 1 is an input impedance waveform of a SAW resonator using a composite substrate of Example 1.

The present invention is a method of manufacturing a composite substrate including a piezoelectric layer and a support substrate. Here, the material used for the piezoelectric layer and the support substrate is not particularly limited, but lithium tantalate or lithium niobate containing Li in the composition is preferable as a piezoelectric material, and these single crystals can be used. In the case where the piezoelectric material is a lithium tantalate single crystal, its crystal orientation is preferably rotated 36° to 49° Y-cut.

Further, the material for the support substrate can be selected from silicon, sapphire, silicon carbide, spinel, or the like, or a laminated substrate containing the aforementioned materials may be used.

The present invention includes a step of performing ion implantation into a piezoelectric substrate. In this step, ions are implanted into an arbitrary depth of the piezoelectric substrate, and in a subsequent step of separating the piezoelectric substrate, the piezoelectric substrate is separated at an ion-implanted portion. Therefore, the depth of ion implantation in this step determines the thickness of a piezoelectric layer after separation of the piezoelectric substrate. Therefore, the depth of ion implantation is preferably equal to the thickness of the target piezoelectric layer of the composite substrate or slightly larger in consideration of a polishing margin and the like. The depth of ion implantation varies depending on the material, ion species, and the like but can be adjusted by an ion acceleration voltage.

The ion species used in the ion implantation step is not particularly limited as long as the ion species disturbs crystallinity of the piezoelectric substrate material. However, the ion species is preferably a light element such as a hydrogen ion, a hydrogen molecular ion, or a helium ion. By use of these ion species, the ion implantation can be performed with a small acceleration voltage, and there are advantages such as few restrictions on the device, small damage to the piezoelectric substrate, and good distribution in the depth direction.

Here, in a case where the ion species used in the ion implantation step is hydrogen ions, the dose amount of the hydrogen ions is preferably $1\times10^{16}$ to $1\times10^{18}$ atm/cm$^2$. In a case where the ion species is hydrogen molecular ions, the dose amount of the hydrogen molecular ions is preferably $1\times10^{16}$ to $2\times10^{18}$ atm/cm$^2$. Further, in a case where the ion species is helium ions, the dose amount of the helium ions is preferably $2\times10^{16}$ to $2\times10^{18}$ atm/cm$^2$.

Further, the present invention includes a step of bonding the piezoelectric substrate and the support substrate. The bonding method in this step is not particularly limited, and the substrates may be bonded via an adhesive or the like, or a direct bonding method such as a diffusion bonding method, a room temperature bonding method, a plasma activation bonding method, or a surface activation normal temperature bonding method can be used. At this time, an intervening layer may be provided between the piezoelectric substrate and the support substrate.

The piezoelectric substrate, such as a lithium tantalate single crystal substrate or a lithium niobate single crystal substrate, and the support substrate, such as silicon or sapphire, have a large difference in thermal expansion coefficient. Therefore, use of a room temperature bonding method is preferable to suppress peeling and defects; meanwhile, a system to be bonded is restricted in the room temperature bonding method. In addition, heat treatment may be required to restore the crystallinity of the piezoelectric layer.

A surface activation treatment method in the surface activation bonding method is not particularly limited, but ozone water treatment, UV ozone treatment, ion beam treatment, plasma treatment, or the like can be used.

In the present invention, after the piezoelectric substrate and the support substrate are bonded, the bonded substrate, at an ion-implanted portion of the piezoelectric substrate, is separated into the piezoelectric layer bonded to the support substrate and the remaining piezoelectric substrate. At this time, the separation method is not particularly limited, but the bonded substrate can be separated by heating the substrate to the temperature of 200° C. or less and applying mechanical stress by wedge or the like to one end of the ion-implanted portion.

Surface roughness and thickness of the piezoelectric layer bonded to the support substrate can be adjusted by polishing a surface of the piezoelectric layer. The surface roughness and the thickness of the piezoelectric layer may be arbitrarily set as required, but the surface roughness is preferably 0.4 nm or less in RMS value and the thickness is preferably about 0.5 to 5 μm. Further, the remaining piezoelectric substrate is re-polished and can be reused as a piezoelectric substrate.

In the method of manufacturing a composite substrate with ion implantation, the thickness of the piezoelectric layer can be controlled to 1.0 μm or less, and the surface roughness can be controlled to 10% or less of the thickness in maximum height Rz value. Preferably, the thickness is controlled to 0.8 μm or less and the surface roughness is controlled to 5% or less of the thickness in maximum height Rz value. Control of the film thickness and uniformity at this level is difficult by the method of polishing and grinding the bonded piezoelectric substrate.

Further, the present invention includes a step of diffusing Li into the piezoelectric layer bonded to the support substrate after the separation step. The Li deficiency of the piezoelectric layer caused in the ion implantation step can be compensated by the step. A method of diffusing Li into the piezoelectric layer is not particularly limited, and Li can be diffused by bringing an Li diffusion source into contact with the piezoelectric layer. At this time, the state of the Li diffusion source may be any of solid, liquid, and gas.

As a specific technique of the Li diffusion step, in the case where the piezoelectric material is LiTaO$_3$, a composition containing Li, Ta, and O as constituent elements is used. For example, Li can be diffused into the piezoelectric layer by embedding the piezoelectric layer bonded to the support substrate in powder containing Li$_3$TaO$_4$ as a main component, and heating the piezoelectric layer. Further, Li can also be diffused into the piezoelectric layer by impregnating the piezoelectric layer bonded to the support substrate into a melt in which LiNO$_3$, NaNO$_3$, KNO$_3$, and the like are mixed at an equimolar ratio.

In the Li diffusion step, Li diffusion is preferably applied to cause the piezoelectric layer to have a quasi-stoichiometric composition. This can improve characteristics such as the electromechanical coupling coefficient, the temperature characteristic, and the Q value, as compared with a case where the piezoelectric layer has an ordinary congruent melting (congruent) composition.

Here, the quasi-stoichiometric composition is determined on the basis of common technical knowledge according to the piezoelectric material, but in the case where the piezoelectric material is LiTaO$_3$, the quasi-stoichiometric composition refers to a composition in which the ratio of Li to Ta is Li:Ta=50−α: 50+α, and α is in a range of −1.0<α<2.5. Further, in the case where the piezoelectric material is LiNbO$_3$, the ratio of Li to Nb is Li:Nb=50−α:50+α, and α is in a range of −1.0<α<2.5.

The Li concentration of the lithium tantalate single crystal substrate and the lithium niobate single crystal substrate may be measured by a known method. For example, the Li concentration can be evaluated by Raman spectroscopy. As for the lithium tantalate single crystal substrate, a roughly linear relationship is known between a full width at half maximum of Raman shift peak and the Li concentration (Li/(Li+Ta) value). Therefore, by use of an expression representing such a relationship, the composition of an oxide single crystal substrate at an arbitrary position can be evaluated.

The relational expression between the full width at half maximum of the Raman shift peak and the Li concentration is obtained by measuring the Raman full width at half maximum of some samples having known composition and different Li concentration. However, in a case where Raman measurement conditions are the same, a relational expression which has already been clarified in documents or the like may be used.

For example, for lithium tantalate single crystal, the following numerical expression 1 may be used (see 2012 IEEE International Ultrasonics Symposium Proceedings, pages 1252-1255).

$$Li/(Li+Ta)=(53.15-0.5FWHM1)/100 \quad [\text{Expression 1}]$$

Here, "FWHM 1" is the full width at half maximum of the Raman shift peak around 600 cm$^{-1}$. Please refer to the document for details of measurement conditions.

In the case of using the lithium tantalate single crystal substrate or the lithium niobate single crystal substrate as the piezoelectric substrate, one having roughly uniform Li concentration in the thickness direction can be used, and the Li concentration can be set to have the congruent composition or the quasi-stoichiometric composition.

A piezoelectric single crystal substrate having the congruent composition is preferable because the substrate can be relatively easily produced by a Czochralski method or the like. Meanwhile, in the case of using the piezoelectric single crystal substrate having the quasi-stoichiometric composition, the step of diffusing Li into the piezoelectric layer bonded to the support substrate can be performed in a short time.

The piezoelectric single crystal substrate having the quasi-stoichiometric composition can be obtained by a known double crucible method, but the cost increases if this substrate is used. Therefore, the lithium tantalate single crystal substrate or the lithium niobate single crystal substrate having a range in which the Li concentration varies in the thickness direction can be used. That is, a piezoelectric substrate having the quasi-stoichiometric composition at a portion serving as a piezoelectric layer when the substrate is bonded to the support substrate to form a composite substrate can be used.

Such a piezoelectric substrate is obtained by diffusing Li from a surface of the piezoelectric single crystal substrate having the congruent composition into an interior of the substrate. At this time, the piezoelectric substrate having the quasi-stoichiometric composition in the surface and the congruent composition in the interior can be obtained by adjusting reaction time, reaction temperature, and the like. Further, the piezoelectric substrate preferably has the quasi-stoichiometric composition in at least up to the depth equivalent to a targeted thickness of the piezoelectric layer from the surface of the substrate.

Specifically, in the case of using the lithium tantalate substrate as the piezoelectric substrate, the lithium tantalate substrate preferably has a portion where the Li concentration is 48.5±0.5 mol % and a portion where the Li concentration is 50.0±0.5 mol %, and has a range in which the Li concentration becomes higher on the surface side of the substrate in the thickness direction.

Further, in the case of using the lithium tantalate substrate or the lithium niobate substrate as the piezoelectric substrate, the Li concentration at the depth position implanted with ions, of the piezoelectric substrate, is preferably greater than 50.0 mol %, more preferably 50.05 mol % or more, and even more preferably 50.1 mol % or more. In this way, even if the Li concentration decreases due to ion implantation, the Li concentration of the piezoelectric layer can be set to greater than 49.9 mol %, and excellent characteristics can be obtained.

The Li concentration at the depth position implanted with ions, of the piezoelectric substrate, is preferably 52.5 mol % or less, more preferably 51.0 mol % or less, and even more preferably 50.5 mol % or less.

Further, the Li concentration, at a range from the surface of the piezoelectric substrate on the side bonded to the support substrate to the depth position implanted with ions, is preferably from 49.0 mol % to 52.5 mol %, both inclusive. The Li concentration is more preferably 49.5 mol % or more, still more preferably greater than 50.0 mol %, and even more preferably 50.1 mol % or more.

The present inventors have found that the Li concentration of the piezoelectric substrate correlates with the decrease in the Li concentration due to ion implantation. That is, the amount of decrease in the Li concentration when ions are implanted into the piezoelectric substrate having the quasi-stoichiometric composition is smaller than the amount of decrease in the Li concentration when ions are implanted into the piezoelectric substrate having the congruent composition. That is, in the case of the piezoelectric substrate having the congruent composition, a decrease of about 0.4 mol % is observed, but in the case of the piezoelectric substrate having the quasi-stoichiometric composition, the decrease is about 0.1 mol % and the variation is small.

Therefore, if the Li concentration, at a range from the surface of the piezoelectric substrate on the side bonded to the support substrate to the depth position implanted with ions, particularly, the Li concentration at the depth position implanted with ions is set to greater than 50.0 mol %, the step of diffusing Li into the piezoelectric layer may be omitted after the step of separating the piezoelectric substrate.

As will be described below, ion implantation into the piezoelectric substrate sometimes impairs piezoelectric properties of the portion where the ions have passed. However, by the above step, the piezoelectric properties are less likely to be impaired and the piezoelectric properties are exerted without recovery treatment.

According to the present invention, by use of the Li diffusion, the composite substrate in which the Li concentration of the surface of the piezoelectric layer is greater than 49.9 mol %, the thickness of the piezoelectric layer is 1.0 μm or less, and the maximum height Rz value of the surface roughness of the piezoelectric layer is 10% or less of the thickness of the piezoelectric layer, which cannot be conventionally obtained, can be produced.

The Li concentration of the surface of the piezoelectric layer is preferably 49.95 mol % or more, and is preferably 52.0 mol % or less.

Further, the thickness of the piezoelectric layer is preferably 0.8 μm or less, and is preferably 0.6 μm or less. The maximum height Rz value of the surface roughness of the piezoelectric layer is preferably 5% or less of the thickness of the piezoelectric layer, and more preferably 1% or less.

Note that the maximum height Rz is a parameter defined in JIS B 0601:2013 (ISO 4287:1997), and can be measured on the basis of these standards.

Further, in the manufacturing method of the present invention, an intervening layer may be provided between the piezoelectric layer and the support substrate of the composite substrate. The material of the intervening layer is not particularly limited, but an inorganic material is preferable and may contain, for example $SiO_2$, $SiO_{2\pm 0.5}$, $SiO_2$ doped with Ti, a-Si, p-Si, a-SiC, or $Al_2O_3$ as main components.

Further, in the intervening layer, a layer composed of a plurality of materials may be stacked.

By the way, the piezoelectric properties in the portion where the ions have passed may be impaired by the ion implantation into the piezoelectric substrate. Therefore, a step of increasing a temperature of the piezoelectric substrate to a temperature equal to or higher than a Curie temperature and decreasing the temperature of the piezoelectric substrate to a temperature equal to or lower than the Curie temperature while an electric field is applied, after bonding the piezoelectric substrate and the support substrate, is preferably performed. By the above step, the piezoelectric properties of the piezoelectric layer can be restored. Further, this step may be simultaneously performed with the step of diffusing Li into the piezoelectric layer.

In the above step, application of an electric field is sometimes difficult depending on the type of the support substrate, and the piezoelectric properties can be restored by increasing the temperature of the piezoelectric substrate. The temperature at this time is preferably equal to or lower than the Curie temperature and is about 500° C. to 700° C.

EXAMPLES

Hereinafter, the present invention will be specifically described with reference to examples, but the present invention is not limited to the following examples.

Example 1

In Example 1, first, a 4-inch diameter lithium tantalate (Li:Ta=48.3:51.7) single crystal ingot having the congruent composition to which single polarization treatment has been applied was sliced, lapped, and polished, and a 42° rotated Y-cut lithium tantalate substrate with the thickness of 250 μm and a single side mirror surface was prepared.

Next, a sapphire substrate with the thickness of 500 μm and a single side mirror surface was prepared as the support substrate. Then, it was confirmed that the surface roughness of the mirror surface of the LT substrate and the sapphire substrate was 1.0 nm or less in RMS value. Subsequently, hydrogen molecular ions were implanted from the mirror surface side of the LT substrate. The dose amount at this time was $9 \times 10^{16}$ atm/cm$^2$ and the acceleration voltage was 160 KeV.

The ion-implanted LT substrate and sapphire substrate were bonded using a room temperature bonding method described in "Takagi H. et al, "Room-temperature wafer bonding using argonbeam activation" From Proceedings-Electrochemical Society (2001), 99-35 (Semiconductor Wafer Bonding: Science, Technology, and Applications V), 265-274.".

Specifically, the cleaned LT substrate and sapphire substrate were set in a high vacuum chamber, and activation treatment was performed by irradiating the substrate surface to be bonded with a fast-atomic beam of neutralized argon. Thereafter, the LT substrate and the sapphire substrate were bonded to each other.

Thereafter, the bonded substrate was heated to 110° C., and a wedge was applied to one end of the ion-implanted portion of the piezoelectric substrate to separate the bonded substrate into the piezoelectric layer bonded to the support substrate and the remaining piezoelectric substrate.

The thickness of the piezoelectric layer at this time was 900 nm, but the surface of the piezoelectric layer was polished by 200 nm to make the thickness of the piezoelectric layer be 700 nm. Further, the maximum height Rz of the surface roughness was measured using an atomic force microscope (AFM), and the value was 1 nm.

Regarding the bonded substrate composed of the piezoelectric layer and the sapphire support substrate, a voltage waveform induced by applying vertical vibration in the thickness direction to a main surface and a back surface was observed using a piezo d33/d15 meter (model ZJ-3BN) manufactured by Voice Research Institute of the Chinese Academy of Sciences. The piezoelectric response was not able to be observed in the bonded substrate and the piezoelectric properties were not able to be confirmed.

Next, the temperature of the bonded substrate was increased to 650° C. that is equal to or higher than the Curie temperature of lithium tantalate, and is gradually decreased to the room temperature while an electric field of 4000 V/m was applied roughly in a +Z direction of the LT substrate.

After this polarization treatment, the voltage waveform induced by applying vertical vibration in the thickness direction to the main surface and the back surface was observed again using a piezo d33/d15 meter (model ZJ-3BN) manufactured by Voice Research Institute of the Chinese Academy of Sciences. The piezoelectric response was observed at all portions of the bonded substrate and the piezoelectric properties were able to be confirmed.

Next, with respect to several portions of the surface of the piezoelectric layer, the full width at half maximum (FWHM1) of the Raman shift peak around 600 cm$^{-1}$, which serves as an index of the Li amount, was measured using a laser Raman spectrometer (LabRam HR series manufactured by HORIBA Scientific Inc., Ar ion laser, spot size 1 μm, room temperature), and the Li amount was calculated from the measured full width at half maximum using the above-mentioned numerical expression 1.

As a result, the Li amount of the surface of the piezoelectric layer had variation of 47.9 to 48.2 mol %. Note that the Li amount was similarly calculated for the surface of the LT substrate before the ion implantation, and the Li amount at that time was uniform at 48.3 mol %.

Therefore, in this LT substrate, the Li amount decreases by up to 0.4 mol % due to ion implantation.

Therefore, Li liquid dispersion described in "Appl. Pysic. Lett, Vol. 62, 2468 (1993)" was applied to this bonded substrate having variation. Specifically, LiNO$_3$, NaNO$_3$, and KNO$_3$ were mixed at an equimolar ratio in an alumina container, heated to 300° C., and the bonded substrate to which the polarization treatment has been applied was impregnated in this melt for 12 hours.

After such Li diffusion treatment, the bonded substrate was cleaned to complete a composite substrate composed of the LT piezoelectric layer and the sapphire support substrate. Subsequently, Raman spectroscopic measurement was performed for the prepared composite substrate in a similar manner to the above, and the Li amount of the surface of the piezoelectric layer was calculated. As a result, the Li amount was uniform at 48.3 mol % in all the measured portions.

Next, the surface of the piezoelectric layer of the composite substrate was sputtered to form an Al film having the thickness of 0.4 μm. Subsequently, a resist was applied, an electrode pattern of a resonator was exposed and developed using a stepper, and an electrode of a SAW device was formed by reactive ion etching (RIE). Here, one wavelength of the resonator was 5 μm.

With respect to the resonator prepared in this manner, an input impedance waveform of the SAW was confirmed using an RF prober, and the result illustrated in FIG. 1 was obtained. FIG. 1 also illustrates, for comparison, an input impedance waveform of a resonator (Comparative Example 1) using a composite substrate similarly prepared to Example 1 except that the Li diffusion treatment is not applied.

Figure 2:
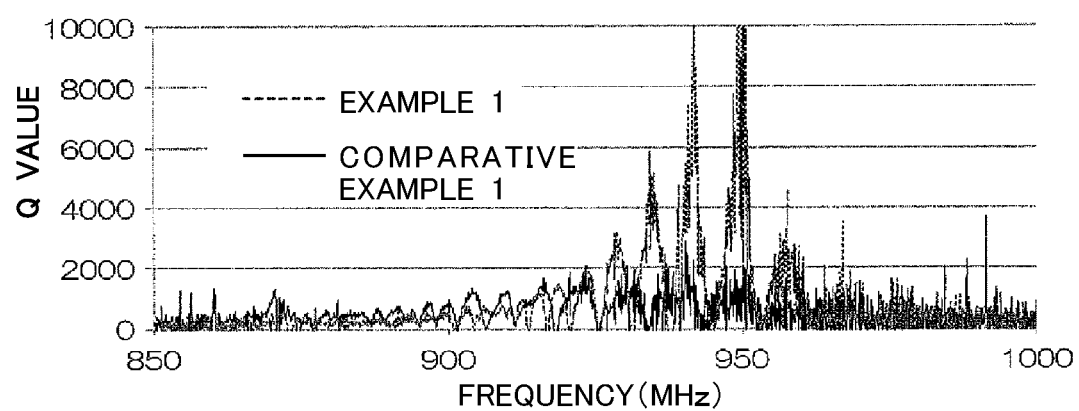
FIG. 2 is a graph illustrating Q values of the SAW resonator using the composite substrate of Example 1.

Further, FIG. 2 illustrates Q values of the resonators of Example 1 and Comparative Example 1. Note that the Q value was obtained by the following numerical expression 2 (see 2010 IEEE International Ultrasonics Symposium Proceedings, pages 861 to 863).

$$Q(f)=\omega^*\tau(f)^*|\Gamma|/(1-|\Gamma|^2) \qquad \text{[Expression 2]}$$

Here ω is an angular frequency, τ(f) is a group delay time, and Γ is a reflection coefficient measured by a network analyzer.

Further, Table 1 below illustrates values of an electromechanical coupling coefficient ($K^2$) of the resonator of Example 1, a maximum value of the Q value, and frequency temperature coefficients (TCF) of resonance frequency and antiresonance frequency in a temperature range of 20° C. to 85° C. Here, the electromechanical coupling coefficient ($K^2$) was obtained by the following numerical expression 3.

$$K^2=(\pi fr/2fa)/\tan(\pi fr/2fa) \qquad \text{[Expression 3]}$$

fr: the resonance frequency
fa: the antiresonance frequency

Furthermore, Table 1 below further illustrates values of a resonance load Qso and antiresonance load Qpo calculated by the following numerical expression 4 by an MBVD model (see John D. et al., "Modified Butterworth-Van Dyke Circuit for FBAR Resonators and Automated Measurement System", IEEE ULTRASONICS SYMPOSIUM, 2000, pp. 863-868).

$$Z(\omega) = \frac{X_p}{j \cdot \left(\frac{\omega}{\omega_p}\right)} \cdot \frac{\left[1-\left(\frac{\omega}{\omega_s}\right)^2 + j \cdot \left(\frac{\omega}{\omega_s}\right)\frac{1}{Q_{so}}\right]}{\left[1-\left(\frac{\omega}{\omega_p}\right)^2 + j \cdot \left(\frac{\omega}{\omega_p}\right)\frac{1}{Q_{po}}\right]} \qquad \text{[Expression 4]}$$

Here, $r = \dfrac{C_0}{C_1}$ $\omega_s = \dfrac{1}{\sqrt{L_1 \cdot C_1}}$ $\left(\dfrac{\omega_p}{\omega_s}\right)^2 = 1 + \dfrac{1}{r}$ $X_p = \dfrac{1}{\omega_p \cdot C_0}$ $\dfrac{1}{Q_s} = \omega_s \cdot R_1 \cdot C_1$ $\dfrac{1}{Q_e} = \dfrac{\omega_s \cdot R_0 \cdot C_0}{r}$ $\dfrac{1}{Q_{so}} = \dfrac{1}{Q_s} \cdot \left(1 + \dfrac{R_s}{R_1}\right)$ $\dfrac{1}{Q_{po}} = \left(\dfrac{\omega_p}{\omega_s}\right)\left(\dfrac{1}{Q_s} + \dfrac{1}{Q_e}\right)$ Table 1 below further illustrates, for comparison, results of Comparative Example 1 and a resonator (Comparative Example 2) using a 42° Y-cut LT single crystal substrate having the Li amount of 48.3 mol % (congruent composition).

Example 2

In Example 2, ion implantation was performed into the LT substrate to bond the LT substrate and the sapphire substrate in a similar manner to Example 1. Further, the LT substrate was separated at the ion-implanted portion, and the surface of the piezoelectric layer was polished to obtain a bonded substrate composed of the LT piezoelectric layer and the sapphire support substrate.

Subsequently, the bonded substrate was embedded in powder containing $Li_3TaO_4$ as a main component and spread in a small container. At this time, the powder containing $Li_3TaO_4$ as a main component was prepared by firing powder mixed at the molar ratio of $Li_2CO_3:Ta_2O_5=7:3$ at 1300° C. for 12 hours.

Next, this small container was set in an electric furnace, and the interior of the furnace was set to an $N_2$ atmosphere and heated at 750° C. for 100 hours. Subsequently, an electric field of 4000 V/m was applied roughly in the +Z axis direction of the LT substrate, and then the temperature gradually fell to the room temperature, between 750° C. and 500° C. in the temperature fall process.

After such Li diffusion treatment, the surface of the piezoelectric layer was polished by about 10 nm to complete a composite substrate composed of the LT piezoelectric layer and the sapphire support substrate. No cracks and splits occurred in the composite substrate. Further, the maximum height Rz of the surface roughness was measured using an atomic force microscope (AFM), and the value was 1 nm.

Then, regarding the composite substrate fabricated in this manner, the voltage waveform induced by applying vertical vibration in the thickness direction to the main surface and the back surface was observed as in Example 1. The piezoelectric response was observed at all portions of the bonded substrate and the piezoelectric properties were able to be confirmed.

Further, laser Raman spectroscopy measurement was performed on several portions of the surface of the piezoelectric layer and the Li amount was calculated as in Example 1. As a result, all the measured portions had the Li amount of 50.2 mol % and had the uniform quasi-stoichiometric composition.

Further, with respect to the composite substrate of Example 2, an electrode was formed to produce a resonator similarly to Example 1. This SAW resonator was evaluated similarly to Example 1, and a result of the evaluation is illustrated in Table 1 below.

Example 3

In Example 3, first, a 42° rotated Y-cut lithium tantalate substrate with the thickness of 300 μm was cut from a 4-inch diameter lithium tantalate (Li:Ta=48.3:51.7) single crystal ingot having a congruent composition to which single polarization treatment has been applied. Next, the surface roughness of the cut LT substrate was made to be 0.15 μm in the arithmetic average roughness Ra value by a lapping step, and the thickness of the LT substrate was set to 250 μm.

Further, both surfaces of the LT substrate were polished and finished to a quasi-mirror surface having the surface roughness of 0.01 μm in the Ra value. Subsequently, the LT substrate was embedded in powder containing $Li_3TaO_4$ as a main component and spread in a small container. At this time, the powder containing $Li_3TaO_4$ as a main component was prepared by firing powder mixed at the molar ratio of $Li_2CO_3:Ta_2O_5=7:3$ at 1300° C. for 12 hours.

Next, this small container was set in an electric furnace, and the interior of the furnace was set to an $N_2$ atmosphere and heated at 975° C. for 24 hours, and Li was diffused into the LT substrate. After this treatment, mirror polishing was applied to one side of the LT substrate.

Figure 3:
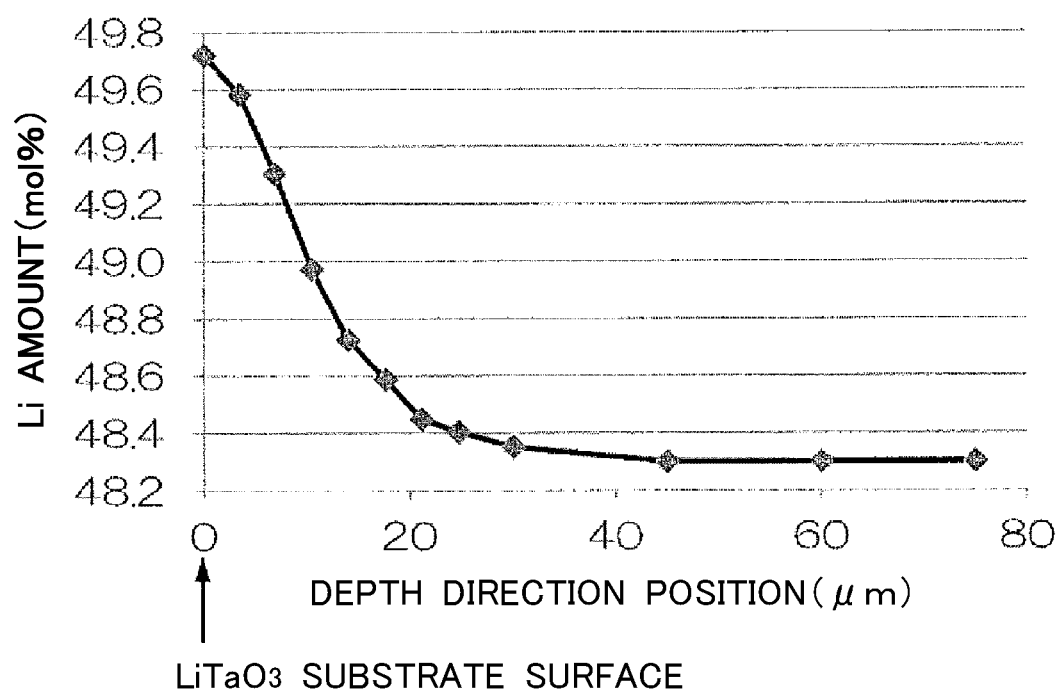
FIG. 3 is a graph illustrating a profile, in a depth direction, of a Li amount in an LT substrate of Example 3.
Figure 4:
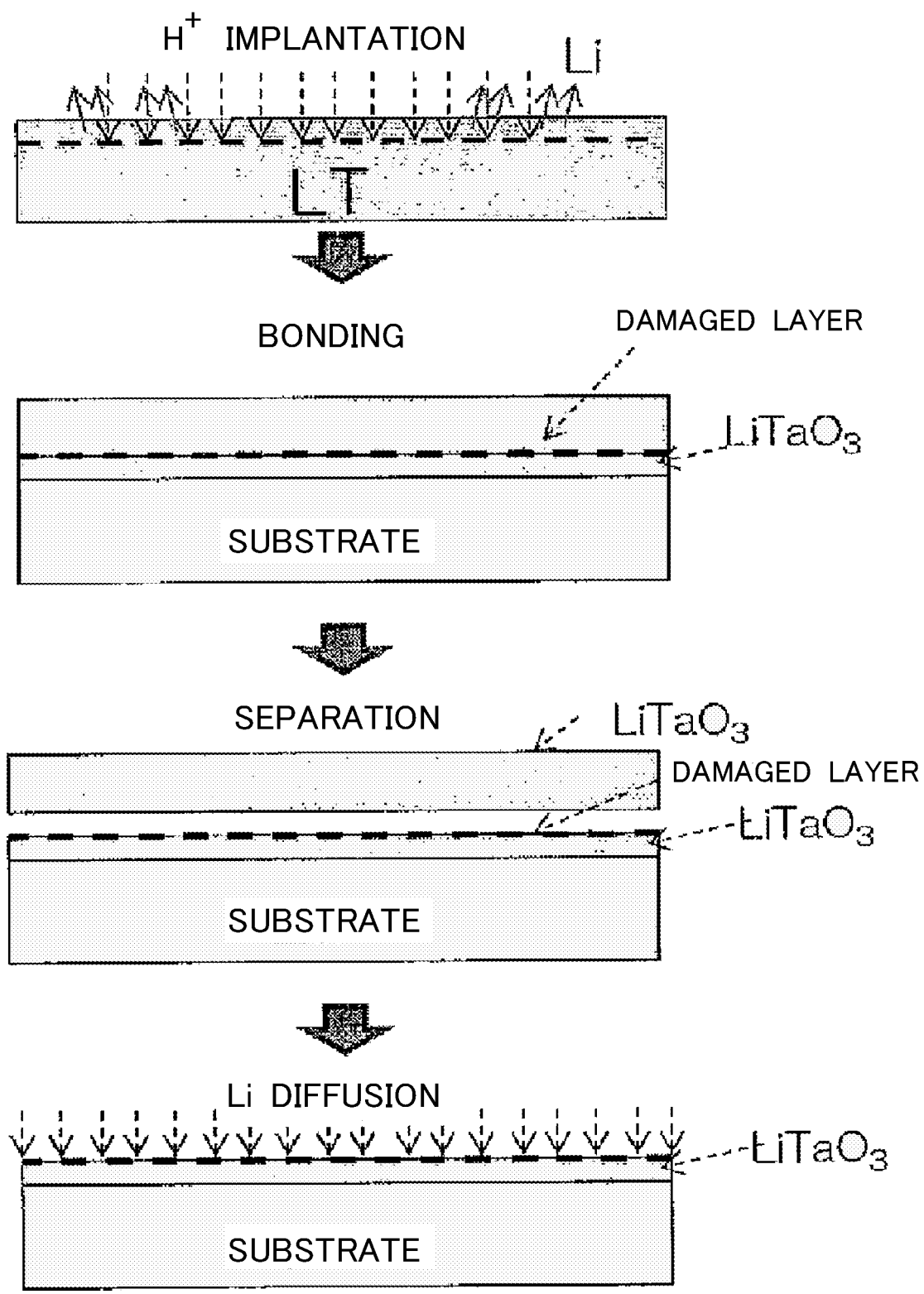
FIG. 4 is a diagram illustrating an example of a production flow of a composite substrate of the present application.

Then, regarding the LT substrate to which the Li diffusion treatment has been applied, the full width at half maximum (FWHM1) of the Raman shift peak around 600 cm$^{-1}$ was measured in the depth direction from the surface using a laser Raman spectrometer similar to Example 1, and the Li amount was calculated from the measured full width at half maximum using the above-mentioned numerical expression 1. The profile, in the depth direction, of the Li amount illustrated in FIG. 3 was obtained.

Next, a sapphire substrate with the thickness of 500 μm and a single side mirror surface was prepared as the support substrate. Then, it was confirmed that the surface roughness of the mirror surface of the LT substrate and the sapphire substrate to which the Li diffusion treatment has been applied was 1.0 nm or less in RMS value.

Subsequently, hydrogen molecular ions were implanted from the mirror surface side of the LT substrate. The dose amount at this time was $9\times10^{16}$ atm/cm$^2$ and the acceleration voltage was 160 KeV.

Next, the ion-implanted LT substrate and the sapphire substrate were bonded using the surface activation normal temperature bonding method as in Example 1. Further, the LT substrate was separated at the ion-implanted portion, and the surface of the piezoelectric layer was polished to obtain a bonded substrate composed of the LT piezoelectric layer and the sapphire support substrate by a method similar to Example 1.

The thickness of the piezoelectric layer at this time was 900 nm, but the surface of the piezoelectric layer was polished by 200 nm to make the thickness of the piezoelectric layer be 700 nm.

Further, laser Raman spectroscopy measurement was performed on several portions of the surface of the piezoelectric layer and the Li amount was calculated as in Example 1. As a result, the surface of the piezoelectric layer had variation in the Li amount of 49.5 to 49.6 mol % Note that the Li amount was similarly calculated for the surface of the LT substrate before the ion implantation, and the Li amount at that time was uniform at 49.7 mol %.

Therefore, in this LT substrate, the Li amount decreases by up to 0.2 mol % due to ion implantation.

Subsequently, the bonded substrate was embedded in powder containing $Li_3TaO_4$ as a main component and spread in a small container. At this time, the powder containing $Li_3TaO_4$ as a main component was prepared by firing powder mixed at the molar ratio of $Li_2CO_3:Ta_2O_5=7:3$ at 1300° C. for 12 hours.

Then, this small container was set in an electric furnace, and the interior of the furnace was set to an $N_2$ atmosphere and heated at 750° C. for 20 hours. Subsequently, an electric field of 4000 V/m was applied roughly in the +Z axis direction of the LT substrate, and then the temperature gradually fell to the room temperature, between 750° C. and 500° C. in the temperature fall process.

After such Li diffusion treatment, the surface of the piezoelectric layer was polished by about 10 nm to complete a composite substrate composed of the LT piezoelectric layer and the sapphire support substrate. No cracks and splits occurred in the composite substrate. Further, the maximum height Rz of the surface roughness was measured using an atomic force microscope (AFM), and the value was 1 nm.

Regarding the composite substrate fabricated in this manner, the voltage waveform induced by applying vertical vibration in the thickness direction to the main surface and the back surface was observed as in Example 1. The piezoelectric response was observed at all portions of the bonded substrate and the piezoelectric properties were able to be confirmed.

Further, laser Raman spectroscopy measurement was performed on several portions of the surface of the piezoelectric layer and the Li amount was calculated as in Example 1. As a result, all the measured portions had the Li amount of 50.2 mol % and had the uniform quasi-stoichiometric composition.

Further, with respect to the composite substrate of Example 3, an electrode was formed to produce a resonator similarly to Example 1. This SAW resonator was evaluated similarly to Example 1, and a result broadly similar to Example 2 was obtained.

Example 4

In Example 4, an LT substrate to which the Li diffusion treatment was prepared was prepared by a similar method to Example 3. The profile of the Li amount of the LT substrate in the depth direction is similar to that of Example 3 illustrated in FIG. 3.

Next, hydrogen molecular ions were implanted from the mirror surface side of the LT substrate. The dose amount at this time was $9\times10^{16}$ atm/cm$^2$ and the acceleration voltage was 160 KeV.

Subsequently, an $SiO_2$ film having the thickness of 5 μm was deposited on the mirror surface side of the ion-implanted LT substrate by a room temperature CVD method. The LT/$SiO_2$ substrate was heated at 350° C. for 48 hours to degas, and then the $SiO_2$ film was polished to have the thickness of 2.7 μm.

Next, a Si($SiO_2$/Si) substrate having a mirror surface on one side and having an oxidized ($SiO_2$) film formed on a surface was prepared as the support substrate. The thickness of this support substrate was 400 μm, and the thickness of the oxide film was 0.3 μm.

Further, an a-Si film having the thickness of 50 nm was formed on the mirror surface side of the $SiO_2$/Si substrate by a room temperature CVD method. It was confirmed that the surface roughness of the mirror surface of the LT/$SiO_2$ substrate and the a-Si/$SiO_2$/Si substrate was 1.0 nm or less in RMS value.

Subsequently, these substrates were bonded by the surface activation normal temperature bonding method by plasma activation treatment. Further, the LT substrate was separated at the ion-implanted portion, and the surface of the piezoelectric layer was polished to obtain a bonded substrate composed of the LT piezoelectric layer and the Si support substrate by a method similar to Example 1.

The thickness of the piezoelectric layer at this time was 900 nm, but the surface of the piezoelectric layer was polished by 200 nm to make the thickness of the piezoelectric layer be 700 nm. Here, an intervening layer exists between the LT piezoelectric layer and the Si support substrate, and the intervening layer has an $SiO_2$/a-Si/$SiO_2$ laminated structure.

Further, laser Raman spectroscopy measurement was performed on several portions of the surface of the piezoelectric layer and the Li amount was calculated as in Example 1. As a result, the surface of the piezoelectric layer had variation in the Li amount of 49.5 to 49.6 mol % Note that the Li amount was similarly calculated for the surface of the LT substrate before the ion implantation, and the Li amount at that time was uniform at 49.7 mol %.

Therefore, in this LT substrate, the Li amount decreases by up to 0.2 mol % due to ion implantation.

Next, the bonded substrate was embedded in powder containing $Li_3TaO_4$ as a main component and spread in a small container. At this time, the powder containing $Li_3TaO_4$ as a main component was prepared by firing powder mixed at the molar ratio of $Li_2CO_3$:$Ta_2O_5$=7:3 at 1300° C. for 12 hours.

Then, this small container was set in an electric furnace, and the interior of the furnace was set to an $N_2$ atmosphere and heated at 750° C. for 20 hours. Subsequently, an electric field of 4000 V/m was applied roughly in the +Z axis direction of the LT substrate, and then the temperature gradually fell to the room temperature, between 750° C. and 500° C. in the temperature fall process.

After such Li diffusion treatment, the surface of the piezoelectric layer was polished by about 10 nm to complete a composite substrate composed of the LT piezoelectric layer and the Si support substrate. No cracks and splits occurred in the composite substrate. Further, the maximum height Rz of the surface roughness was measured using an atomic force microscope (AFM), and the value was 1 nm.

Regarding the composite substrate fabricated in this manner, the voltage waveform induced by applying vertical vibration in the thickness direction to the main surface and the back surface was observed as in Example 1. The piezoelectric response was observed at all portions of the bonded substrate and the piezoelectric properties were able to be confirmed.

Further, laser Raman spectroscopy was performed on several portions of the surface of the piezoelectric layer and the Li amount was calculated as in Example 1. As a result, all the measured portions had the Li amount of 50.2 mol % and had the uniform quasi-stoichiometric composition.

Further, with respect to the composite substrate of Example 4, an electrode was formed to produce a resonator similarly to Example 1. This SAW resonator was evaluated similarly to Example 1, and a result of the evaluation is illustrated in Table 1 below.

time, the powder containing $Li_3TaO_4$ as a main component was prepared by firing powder mixed at the molar ratio of $Li_2CO_3$:$Ta_2O_5$=7:3 at 1300° C. for 12 hours.

Next, this small container was set in an electric furnace, and the interior of the furnace was set to an $N_2$ atmosphere and heated at 990° C. for 50 hours, and Li was diffused into the LT substrate. After this treatment, mirror polishing was applied to one side of the LT substrate.

Figure 5:
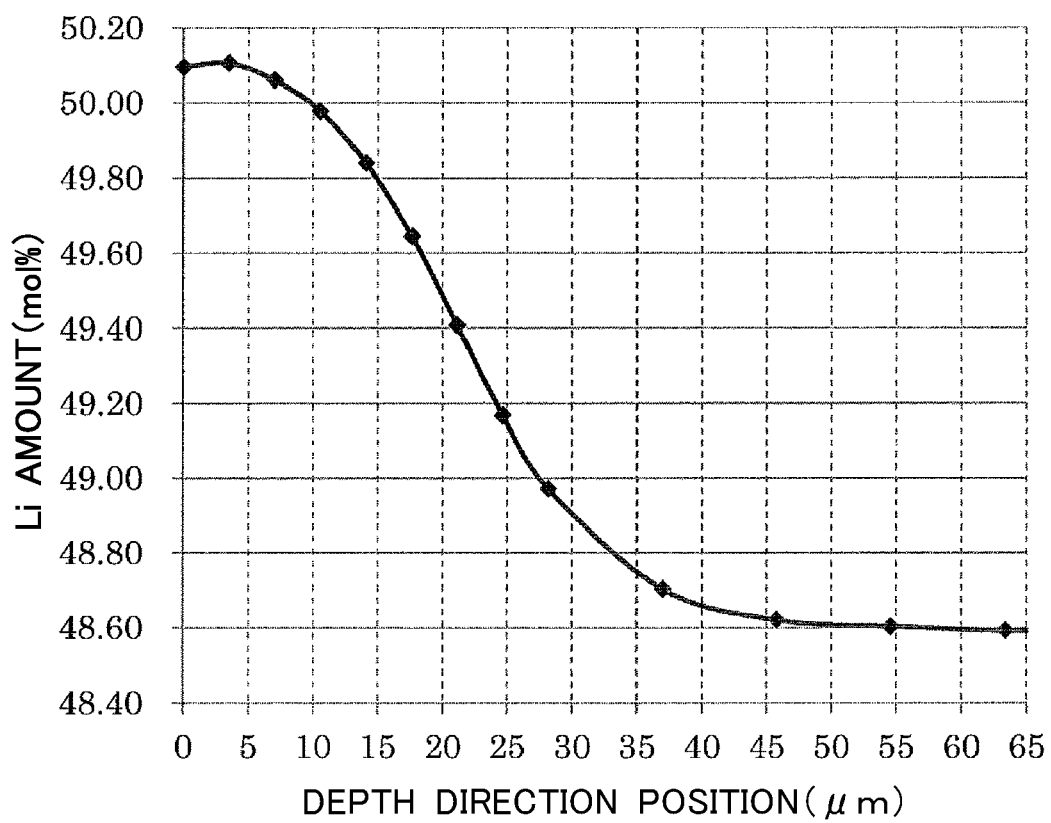
FIG. 5 is a graph illustrating a profile, in a depth direction, of a Li amount in an LT substrate of Example 5.

Then, regarding the LT substrate to which the Li diffusion treatment has been applied, the full width at half maximum (FWHM1) of the Raman shift peak around 600 $cm^{-1}$ was measured in the depth direction from the surface using a laser Raman spectrometer similar to Example 1, and the Li amount was calculated from the measured full width at half maximum using the above-mentioned numerical expression 1. The profile, in the depth direction, of the Li amount illustrated in FIG. 5 was obtained.

Next, a sapphire substrate with the thickness of 500 μm and a single side mirror surface was prepared as the support substrate. Then, it was confirmed that the surface roughness of the mirror surface of the LT substrate and the sapphire substrate to which the Li diffusion treatment has been applied was 1.0 nm or less in RMS value.

Subsequently, hydrogen molecular ions were implanted from the mirror surface side of the LT substrate. The dose amount at this time was $9 \times 10^{16}$ $atm/cm^2$ and the acceleration voltage was 160 KeV. At this time, the position at which ions are implanted is a position at the depth of 900 nm from the surface, and the Li amount at that position is 50.1 mol %.

Next, the ion-implanted LT substrate and the sapphire substrate were bonded using the surface activation normal temperature bonding method as in Example 1. Further, the LT substrate was separated at the ion-implanted portion, and the surface of the piezoelectric layer was polished to obtain a bonded substrate composed of the LT piezoelectric layer and the sapphire support substrate by a method similar to Example 1.

TABLE 1

| | Resonance frequency [MHz] | Antiresonance frequency [MHz] | Average sound speed [m/s] | Electro-mechanical coupling coefficient [%] | Temperature coefficient of resonance frequency [ppm/° C.] | Temperature coefficient of antiresonance frequency [ppm/° C.] | Resonance Q value (Qso) | Antiresonance Q value (Qpo) | Maximum value of Q value |
|---|---|---|---|---|---|---|---|---|---|
| Example1 | 909.2 | 934.1 | 4608 | 6.4 | −3 | −12 | 3500 | 3000 | 10000 |
| Example2 | 921.5 | 948.0 | 4674 | 7.7 | +5 | −6 | 4500 | 3700 | 12000 |
| Example4 | 850.0 | 883.0 | 4333 | 10.0 | +9 | −1 | 4000 | 3200 | 11000 |
| Comparative Example1 | 892.3 | 916.7 | 4523 | 6.4 | −3 | −12 | 1150 | 950 | 1800 |
| Comparative Example2 | 787.6 | 812.7 | 4001 | 7.4 | −34 | −44 | 1000 | 500 | 1000 |

Example 5

In Example 5, first, a 42° rotated Y-cut lithium tantalate substrate with the thickness of 300 μm was cut from a 4-inch diameter lithium tantalate (Li:Ta=48.3:51.7) single crystal ingot having a congruent composition to which single polarization treatment has been applied. Next, the surface roughness of the cut LT substrate was made to be 0.15 μm in the arithmetic average roughness Ra value by a lapping step, and the thickness of the LT substrate was set to 250 μm.

Further, both surfaces of the LT substrate were polished and finished to a quasi-mirror surface having the surface roughness of 0.01 μm in the Ra value. Subsequently, the LT substrate was embedded in powder containing $Li_3TaO_4$ as a main component and spread in a small container. At this The thickness of the piezoelectric layer at this time was 900 nm, but the surface of the piezoelectric layer was polished by 200 nm to make the thickness of the piezoelectric layer be 700 nm. Further, the maximum height Rz of the surface roughness was measured using an atomic force microscope (AFM), and the value was 1 nm. No cracks and splits occurred in the composite substrate.

Regarding the composite substrate fabricated in this manner, the voltage waveform induced by applying vertical vibration in the thickness direction to the main surface and the back surface was observed as in Example 1. The piezoelectric response was observed at all portions of the bonded substrate and the piezoelectric properties were able to be confirmed.

Further, laser Raman spectroscopy was performed on several portions of the surface of the piezoelectric layer and the Li amount was calculated as in Example 1. As a result, all the measured portions had the Li amount of 50.0 mol % and had the uniform quasi-stoichiometric composition.

In this LT substrate, the Li amount decreases by up to 0.1 mol % by the ion implantation.

Further, with respect to the composite substrate of Example 5, an electrode was formed to produce a resonator similarly to Example 1. This SAW resonator was evaluated similarly to Example 1, and a result broadly similar to Example 2 was obtained.

Example 6

In Example 6, first, a 42° rotated Y-cut lithium tantalate substrate with the thickness of 300 μm was cut from a 4-inch diameter lithium tantalate (Li:Ta=48.3:51.7) single crystal ingot having a congruent composition to which single polarization treatment has been applied. Next, the surface roughness of the cut LT substrate was made to be 0.15 μm in the arithmetic average roughness Ra value by a lapping step, and the thickness of the LT substrate was set to 250 μm.

Further, both surfaces of the LT substrate were polished and finished to a quasi-mirror surface having the surface roughness of 0.01 μm in the Ra value. Subsequently, the LT substrate was embedded in powder containing $Li_3TaO_4$ as a main component and spread in a small container. At this time, the powder containing $Li_3TaO_4$ as a main component was prepared by firing powder mixed at the molar ratio of $Li_2CO_3:Ta_2O_5=7:3$ at 1300° C. for 12 hours.

Next, this small container was set in an electric furnace, and the interior of the furnace was set to an $N_2$ atmosphere and heated at 990° C. for 50 hours, and Li was diffused into the LT substrate.

Then, regarding the LT substrate to which the Li diffusion treatment has been applied, the full width at half maximum (FWHM1) of the Raman shift peak around 600 $cm^{-1}$ was measured in the depth direction from the surface using a laser Raman spectrometer similar to Example 1, and the Li amount was calculated from the measured full width at half maximum using the above-mentioned numerical expression 1. The profile, in the depth direction, of the Li amount substantially similar to Example 5 illustrated in FIG. 5 was obtained.

Subsequently, hydrogen molecular ions were implanted from the mirror surface side of the LT substrate. The dose amount at this time was $9 \times 10^{16}$ $atm/cm^2$ and the acceleration voltage was 160 KeV. At this time, the position at which ions are implanted is a position at the depth of 900 nm from the surface, and the Li amount at that position is 50.1 mol %.

$SiO_2$ was deposited on the surface of the side implanted with ions of the LT substrate by about 10 μm at 35° C. by a plasma CVD method, and mirror surface polishing was applied to the surface deposited with the $SiO_2$.

Next, an Si($SiO_2$/Si) substrate with the thickness of 500 μm and a thermal oxide film was prepared as a support substrate. It was confirmed that the surface roughness of the mirror surface of the $SiO_2$/LT substrate and the $SiO_2$/Si substrate was 1.0 nm or less in RMS value.

Next, the $SiO_2$/LT substrate and the $SiO_2$/Si substrate were bonded using the surface activation normal temperature bonding method as in Example 1. Further, the LT substrate was separated at the ion-implanted portion, and the surface of the piezoelectric layer was polished to obtain a bonded substrate composed of the LT piezoelectric layer and the Si support substrate by a method similar to Example 1.

In this bonded substrate, an $SiO_2$ layer is present as the intervening layer between the piezoelectric layer and the support substrate.

The thickness of the piezoelectric layer at this time was 900 nm, but the surface of the piezoelectric layer was polished by 200 nm to make the thickness of the piezoelectric layer be 700 nm. Further, the maximum height Rz of the surface roughness was measured using an atomic force microscope (AFM), and the value was 1 nm. No cracks and splits occurred in the composite substrate.

Regarding the composite substrate fabricated in this manner, the voltage waveform induced by applying vertical vibration in the thickness direction to the main surface and the back surface was observed as in Example 1. The piezoelectric response was observed at all portions of the bonded substrate and the piezoelectric properties were able to be confirmed.

Further, laser Raman spectroscopy was performed on several portions of the surface of the piezoelectric layer and the Li amount was calculated as in Example 1. As a result, all the measured portions had the Li amount of 50.0 mol % and had the uniform quasi-stoichiometric composition.

In this LT substrate, the Li amount decreases by up to 0.1 mol % by the ion implantation.

Further, with respect to the composite substrate of Example 6, an electrode was formed to produce a resonator similarly to Example 1. This SAW resonator was evaluated similarly to Example 1, and a result broadly similar to Example 2 was obtained.

Comparative Example 3

In Comparative Example 3, first, a lithium tantalate single crystal substrate (4 inch diameter, the thickness of 300 μm, and 42° rotated Y-cut) having the quasi-stoichiometric composition (Li:Ta=49.95:50.05) was prepared. This LT substrate is composed of a single crystal obtained by a double crucible method, and the whole has the quasi-stoichiometric composition. Mirror polishing was applied to one side of the LT substrate.

Next, a sapphire substrate with the thickness of 500 μm and a single side mirror surface was prepared as the support substrate. Then, it was confirmed that the surface roughness of the mirror surface of the LT substrate and the sapphire substrate to which the Li diffusion treatment has been applied was 1.0 nm or less in RMS value.

Subsequently, hydrogen molecular ions were implanted from the mirror surface side of the LT substrate. The dose amount at this time was $9 \times 10^{16}$ $atm/cm^2$ and the acceleration voltage was 160 KeV. At this time, the position at which ions are implanted is a position at the depth of 900 nm from the surface, and the Li amount at that position is 49.95 mol %.

Next, the ion-implanted LT substrate and the sapphire substrate were bonded using the surface activation normal temperature bonding method as in Example 1. Further, the LT substrate was separated at the ion-implanted portion, and the surface of the piezoelectric layer was polished to obtain a bonded substrate composed of the LT piezoelectric layer and the sapphire support substrate by a method similar to Example 1.

The thickness of the piezoelectric layer at this time was 900 nm, but the surface of the piezoelectric layer was polished by 200 nm to make the thickness of the piezoelectric layer be 700 nm. Further, the maximum height Rz of the surface roughness was measured using an atomic force microscope (AFM), and the value was 1 nm. No cracks and splits occurred in the composite substrate.

Regarding the composite substrate fabricated in this manner, the voltage waveform induced by applying vertical vibration in the thickness direction to the main surface and the back surface was observed as in Example 1. The piezoelectric response was observed at all portions of the bonded substrate and the piezoelectric properties were able to be confirmed.

Further, laser Raman spectroscopy was performed on several portions of the surface of the piezoelectric layer and the Li amount was calculated as in Example 1. As a result, all the measured portions had the Li amount of 49.8 mol % and had the uniform quasi-stoichiometric composition.

In this LT substrate, the Li amount decreases by up to 0.15 mol % due to ion implantation.

Further, with respect to the composite substrate of Comparative Example 3, an electrode was formed to produce a resonator similarly to Example 1. This SAW resonator was evaluated similarly to Example 1, and a result was slightly inferior to Examples 2, 5, 6.

The invention claimed is:

1. A method of manufacturing a composite substrate including a piezoelectric layer and a support substrate, the method comprising:
   performing ion implantation into a piezoelectric substrate;
   bonding the piezoelectric substrate and the support substrate to form a bonded substrate;
   separating the bonded substrate, at an ion-implanted portion of the piezoelectric substrate, into a piezoelectric layer bonded to the support substrate and a remaining piezoelectric substrate after the bonding of the piezoelectric substrate and the support substrate; and
   diffusing Li into the piezoelectric layer after the separating.

2. The method of manufacturing a composite substrate according to claim 1, the method further comprising:
   increasing a temperature of the piezoelectric substrate to a temperature equal to or higher than a Curie temperature and decreasing the temperature of the piezoelectric substrate to a temperature equal to or lower than the Curie temperature while an electric field is applied after the bonding of the piezoelectric substrate and the support substrate.

3. The method of manufacturing a composite substrate according to claim 1, the method further comprising:
   increasing a temperature of the piezoelectric substrate to recover a piezoelectric property, after the bonding of the piezoelectric substrate and the support substrate.

4. The method of manufacturing a composite substrate according to claim 1, wherein the piezoelectric layer is set to have a quasi-stoichiometric composition in the diffusing Li into the piezoelectric layer.

5. The method of manufacturing a composite substrate according to claim 1, wherein the piezoelectric substrate has a range in which Li concentration differs in a thickness direction.

6. The method of manufacturing a composite substrate according to claim 1, wherein the piezoelectric substrate is lithium tantalate or lithium niobate.

7. The method of manufacturing a composite substrate according to claim 1, wherein an intervening layer is provided between the piezoelectric layer and the support substrate.

8. The method of manufacturing a composite substrate according to claim 1, wherein the support substrate contains at least one material selected from silicon, sapphire, silicon carbide, and spinel.

9. The method of manufacturing a composite substrate according to claim 1, wherein the bonding of the piezoelectric substrate and the support substrate is performed by a surface activation normal temperature bonding method.

10. The method of manufacturing a composite substrate according to claim 1, wherein ion species is at least one type of ion selected from a hydrogen ion, a hydrogen molecular ion, and a helium ion, in the performing ion implantation into a piezoelectric substrate.

* * * * *